(12) United States Patent
Yamamoto et al.

(10) Patent No.: US 6,281,524 B1
(45) Date of Patent: Aug. 28, 2001

(54) SEMICONDUCTOR LIGHT-EMITTING DEVICE

(75) Inventors: Masahiro Yamamoto; Hidetoshi Fujimoto, both of Kawasaki; Shin-ya Nunoue, Ichikawa, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/026,686

(22) Filed: Feb. 20, 1998

(30) Foreign Application Priority Data

Feb. 21, 1997 (JP) .................................................. 9-037909

(51) Int. Cl.$^7$ .................................................. H01L 33/00
(52) U.S. Cl. .................................................. 257/99
(58) Field of Search .................................................. 257/99

(56) References Cited

U.S. PATENT DOCUMENTS 5,798,536 * 8/1998 Tsutsui ..................................... 257/99

FOREIGN PATENT DOCUMENTS

| 7-94782 | 4/1995 | (JP) . |
| 8-274414 | 10/1996 | (JP) . |
| 9-129919 | 5/1997 | (JP) . |
| 9-129921 | 5/1997 | (JP) . |
| 9-129931 | 5/1997 | (JP) . |
| 9-129965 | 5/1997 | (JP) . |

* cited by examiner

*Primary Examiner*—James W. Davie
(74) *Attorney, Agent, or Firm*—Oblon, Spivak, McClelland, Maier & Neustadt, P.C.

(57) ABSTRACT

A light-emitting diode has a GaN-based multi-layer structure arranged on a sapphire substrate. A pair of electrode pads are arranged on a light-output face of the multi-layer structure. The first and second electrode pads have a total projected area set at 25% or less of that of the light-output face. The electrode pads are connected to electrode pads on a mount frame by solder wiring layers arranged on an insulating film covering the side wall of the multi-layer structure.

12 Claims, 11 Drawing Sheets

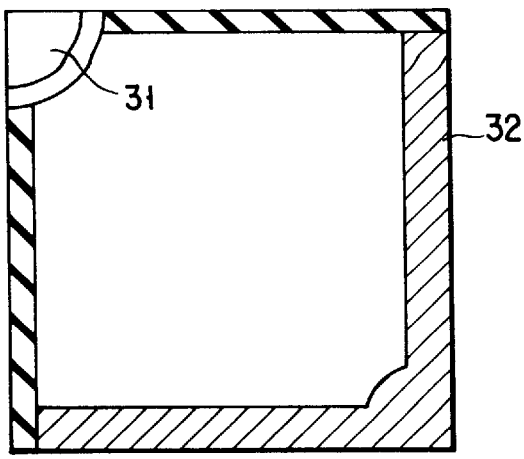
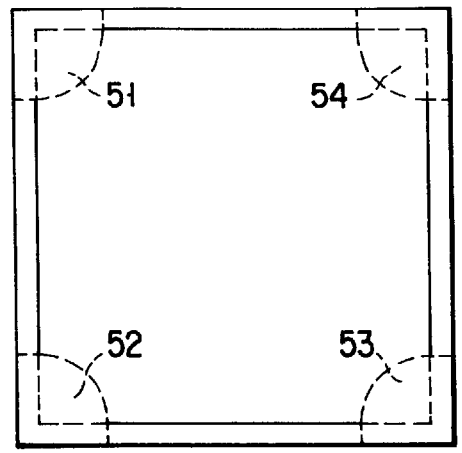
FIG. 9         FIG. 10
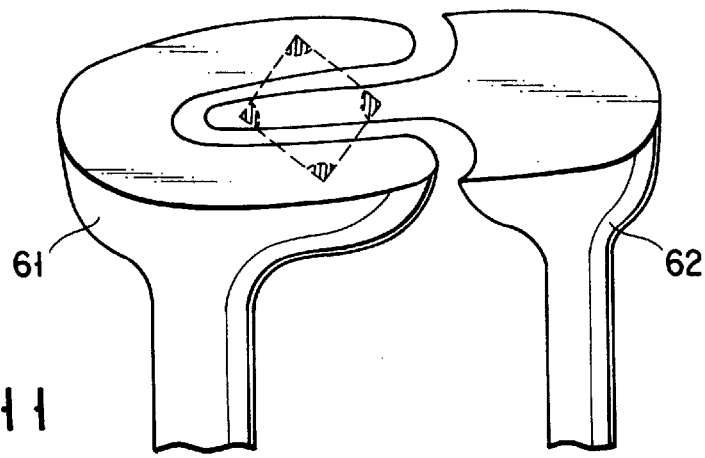
FIG. 11
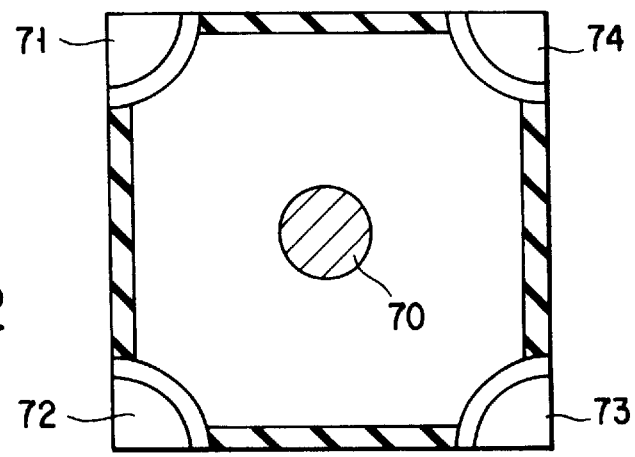
FIG. 12

SEMICONDUCTOR LIGHT-EMITTING DEVICE

BACKGROUND OF THE INVENTION

The present invention relates to a semiconductor light-emitting device arranged on an insulating substrate, and particularly to a semiconductor light-emitting device consisting essentially of gallium nitride compound semiconductors formed on a sapphire substrate.

In recent years, attention has been paid to gallium nitride-based compound semiconductors, such as GaN, as materials of short-wavelength light emitting diodes (LED) or semiconductor laser devices (LD) for use in a range between blue light and ultraviolet. It is expected that a blue light semiconductor laser device using such a material will be applied to a light source for high-density information processing, because of its short oscillation wavelength.

Conventionally, gallium nitride-based compound semiconductor layers are grown and stacked on a sapphire substrate. Where an electrical contact is formed on a layer close to the substrate, among the stacked layers on the substrate, it is necessary to etch and remove part of the surface-side layers, since sapphire is insulating. In a device, such as a light-emitting diode, in which the whole light-emitting intensity is important, the above-described etching process should be considered, because it decreases the light-emitting area of the device, thereby directly lowering the light-emitting intensity.

As shown in Jpn. Pat. Appln. KOKAI Publication No. 6-338632, it has been proposed to arrange a pair of electrodes on diagonally opposite sides in order to increase the light-emitting area. However, this publication only shows a relationship between the position of the electrodes and effective flow of electric current, and does not refer to a method of increasing the light-emitting area or decreasing the electrode area. From the point of view of increasing the light-emitting area itself, it is preferable to lead an electrode out through a hole formed in a top surface, as shown in Jpn. Pat. Appln. KOKAI Publication No. 4-273175. In this proposal, however, since the light-emitting area is shielded by an expanded electrode when viewed from the top, the light-emitting area is substantially not increased.

As described above, a light-emitting device of compound semiconductors arranged on an insulating substrate needs to have a pair of electrodes arranged on its light-output face. Since the electrodes need to be connected to bonding wires, and thus should not be so small, the electrodes cause a decrease in the light-emitting area.

BRIEF SUMMARY OF THE INVENTION

An object of the present invention is to increase the light-emitting area of a light-output face, and to firmly connect electrode pads to outer leads, in a semiconductor light-emitting device arranged on an insulating substrate.

According to a first aspect of the present invention, there is provided a semiconductor light-emitting device having a light-output face facing in a first direction, comprising:

a multi-layer structure defining the light-output face and having a plurality of semiconductor layers stacked in the first direction to form a pn junction for emitting light, the semiconductor layers including a first and second semiconductor layers of first and second conductivity types, respectively, interposing the pn junction;

a first main electrode arranged on the first semiconductor layer, and having a first electrode pad which covers the light-output face and does not transmit an emitted light;

a second main electrode arranged on the second semiconductor layer, and having a second electrode pad which covers the light-output face and does not transmit an emitted light, the first and second electrode pads having a total projected area set at 25% or less of that of the light-output face;

first and second insulating layers arranged on side walls of the multi-layer structure; and first and second wiring layers arranged on the first and second insulating layers, respectively, and connected to the first and second electrode pads, respectively.

According to a second aspect of the present invention, there is provided a semiconductor laser device comprising:

a support substrate consisting essentially of sapphire;

a multi-layer structure having a plurality of gallium nitride-based compound semiconductor layers stacked on the support substrate to form a laser cavity, the semiconductor layers including an active layer and n-type and p-type semiconductor layers interposing the active layer, the n-type semiconductor layer being closer to the support substrate;

a lead-out groove formed in the multi-layer structure to extend in parallel to the laser cavity and have a depth from the p-type semiconductor layer to the n-type semiconductor layer;

a first main electrode arranged in contact with the n-type semiconductor layer at the bottom of the groove; and a second main electrode arranged in contact with the p-type semiconductor layer, wherein the first and second main electrode have first and second electrode pads, respectively, which are arranged on substantially the same plane to interpose the lead-out groove.

According to a third aspect of the present invention, there is provided a semiconductor laser device comprising:

an insulating support substrate;

a multi-layer structure having a plurality of Group III nitride semiconductor layers stacked on the support substrate to form a laser cavity, the semiconductor layers including an active layer and first and second semiconductor layers of first and second conductivity types, respectively, interposing the active layer;

first and second main electrodes arranged on the first and second semiconductor layers, respectively, and having first and second electrode pads, respectively;

an insulating layer arranged on a side wall of the multi-layer structure;

a mount frame supporting the multi-layer structure through the support substrate and having a pair of mount electrode pads used as n-side and p-side electrodes, respectively;

a first wiring layer arranged on or above the insulating layer and electrically connecting the first electrode pad and one of the pair of mount electrode pads, the first wiring layer having a thickness larger than that of the first electrode pad to function as a heat-discharging member for discharging heat generated in the multi-layer structure; and a second wiring layer electrically connecting the second electrode pad and the other of the pair of mount electrode pads.

According to the present invention, electrode pads on a light-output face are decreased in area to increase a light-emitting area, so that a light-emitting device with high brightness is realized. Where the electrode pads of a chip and the electrode pads of a mount frame are connected by solder or face-down, not by means of wire bonding, the connection is ensured even when the electrode pads are small. As a result, a device, which has a semiconductor multi-layer structure arranged on an insulating substrate, can have an increased light-emitting area on its light-output face and reliable wiring connection to its electrode pads. Where the electrode pads of a chip and the electrode pads of a mount frame are electrically connected through thick wiring layers formed by coating, the heat-discharging characteristic of the device can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a horizontally sectional plan view showing a second modification of the device according to the first embodiment;

FIG. 10 is a view showing the plan layout of a light-emitting diode according to a second embodiment of the present invention;

FIG. 11 is a perspective view showing a mount frame according to the second embodiment;

FIG. 12 is a horizontally sectional plan view showing a light-emitting diode according to a third embodiment of the present invention;

DETAILED DESCRIPTION OF THE INVENTION

FIRST EMBODIMENT

Figure 1:
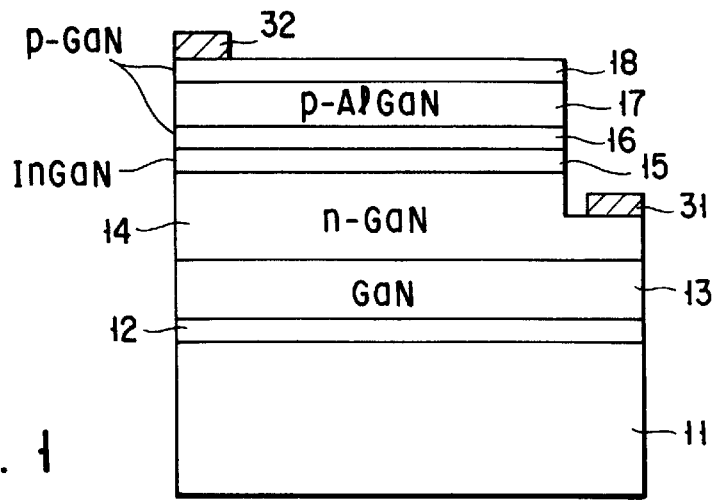
FIG. 1 is a vertically-sectional side view showing the main part of a light-emitting diode according to a first embodiment of the present invention.

FIG. 1 is a vertically-sectional side view showing the main part of one chip of a light-emitting diode which exemplifies a semiconductor light-emitting device according to a first embodiment of the present invention. The light-emitting diode chip includes a sapphire substrate 11 having a C-plane main surface, on which a multi-layer structure of GaN-based materials is arranged. The multi-layer structure was formed by a conventional MOCVD (Metal Organic Chemical Vapor Deposition) method.

An explanation will be given at first on the manufacturing steps of the multi-layer structure. Metal organic materials used were trimethylgallium (TMG), trimethylaluminium (TMA), trimethylindium (TMI), biscyclopentadienylmagnesium ($Cp_2Mg$), and dimethylzinc (DMZ). Gas materials used were ammonia and silane. Carrier gasses used were hydrogen and nitrogen.

First, a sapphire substrate 11, which had undergone organic washing and acid washing treatments, was transferred into a reaction chamber of an MOCVD apparatus and placed on a susceptor capable of being heated by means of a radio-frequency wave. Then, a vapor-phase etching was performed at 1100° C. for about ten minutes by supplying hydrogen at a rate of 10 L/min under normal pressure, to remove a natural oxide film formed on the surface. Note that temperatures mentioned hereinafter were temperatures indicated through a thermocouple in contact with the susceptor.

Then, the temperature was lowered to 550° C., and by supplying hydrogen at a rate of 15 L/min, nitrogen at 5 L/min, ammonia at 10 L/min, and TMG at 25 cc/min for about four minutes, a GaN buffer layer 12 having a thickness of about 20 nm was formed.

Then, the temperature was raised to 1100° C. while supplying hydrogen at a rate of 15 L/min, nitrogen at 5 L/min, and ammonia at 10 L/min. At this temperature, by supplying hydrogen at a rate of 15 L/min, nitrogen at 5 L/min, ammonia at 10 L/min, and TMG at 100 cc/min for about 60 minutes, an undoped GaN layer 13 having a thickness of about 2 μm was formed. Then, by supplying 10 ppm $SiH_4$, diluted with hydrogen, at 3 cc/min along with the gases described right above for about 120 minutes, an n-type GaN layer 14 having a thickness of about 4 μm was formed.

Then, the temperature was lowered to 800° C. while supplying nitrogen at a rate of 20 L/min and ammonia at 10 L/min for three minutes. At this temperature, by supplying nitrogen at a rate of 20 L/min, ammonia at 10 L/min, TMG at 10 cc/min, TMI at 450 cc/min, silane at 10 cc/min, and DMZ at 30 cc/min for about 30 minutes, an InGaN light-emitting layer 15 of the DA light-emitting type having a thickness of about 0.1 μm was formed.

Then, by supplying hydrogen at a rate of 15 L/min, nitrogen at 5 L/min, ammonia at 10 L/min, TMG at 100 cc/min, and $Cp_2Mg$ at 50 cc/min, for about three minutes, a p-type GaN layer 16 was formed.

Then, the temperature was raised to 1100° C. while supplying nitrogen at a rate of 20 L/min and ammonia at 10 L/min for three minutes. At this temperature, by supplying hydrogen at a rate of 15 L/min, nitrogen at 5 L/min, ammonia at 10 L/min, TMG at 100 cc/min, TMA at 50 cc/min, and $Cp_2Mg$ at 50 cc/min for about 10 minutes, a p-type AlGaN layer 17 having a thickness of about 0.3 μm was formed.

Then, by supplying nitrogen at a rate of 20 L/min, ammonia at 10 L/min, TMG at 100 cc/min, and $Cp_2Mg$ at 100 cc/min for about three minutes, a p-type GaN contact layer 18 having a thickness of about 0.1 μm was formed.

Then, the temperature was lowered to 350° C. while stopping the supply of the TMG and $Cp_2Mg$ from the gases described right above, and, at 350° C., further stopping the supply of nitrogen and ammonia. By doing so, the temperature was lowered to room temperature, and the wafer having grown films was taken out of the reaction chamber.

Figure 2:
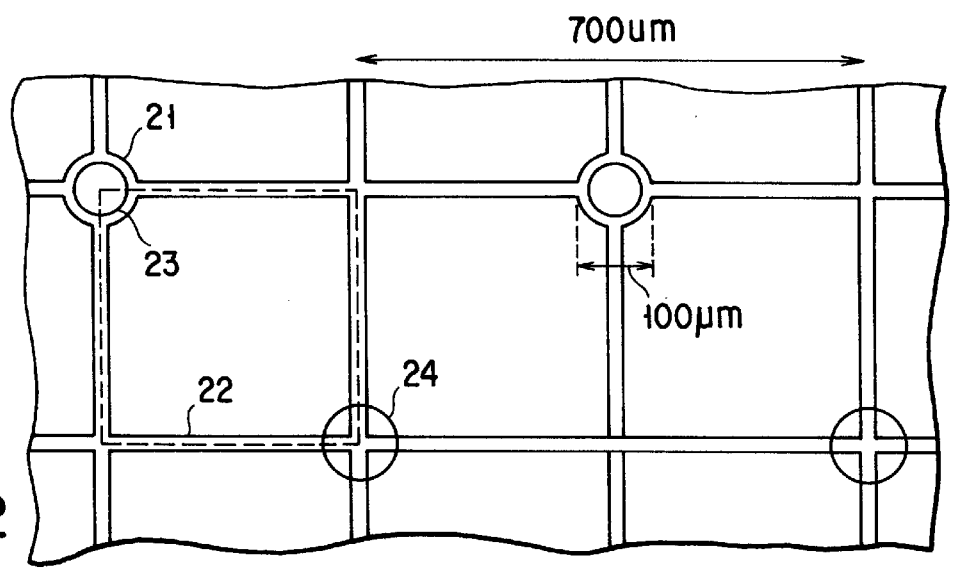
FIG. 2 is a plan view showing contact holes and scribing grooves before a wafer according to the first embodiment is divided into chips.

Then, an $SiO_2$ film and a photo-resist film were formed on the p-type GaN layer 18 by means of a conventional CVD and the like, and holes 21 having a diameter of 100 μm were formed at a pitch of 700 μm by means of a photo-etching process, as shown in FIG. 2. Then, the portion corresponding to the holes 21 were etched by means of a reactive-ion etching, using chlorine gas and the like, to expose the n-type GaN layer 14. Further, grooves 22 having a width of 20 μm were formed in the multi-layer structure along lines connecting the holes 21 and lines extending in parallel with and at the center of the adjacent two of the former lines, i.e., the grooves 22 extending at a pitch of 350 μm in vertical and horizontal directions. The grooves 22 were formed by performing the etching until the sapphire substrate 11 was reached.

Then, after the $SiO_2$ film and the photo-resist film were removed, an $SiO_2$ film 40 was formed all over and a photo-resist film were formed thereon to have a pattern corresponding to holes 23 and 24 described below. Then, using the photo-resist film as a mask, the $SiO_2$ film 40 was etched to form the holes 23 having a diameter of 80 μm in coaxial with the holes 21 of 100 μm previously formed, and to form the holes 24 having a diameter of 100 μm at positions shifted from the holes 23 by 350 μm in vertical and horizontal directions, i.e., a pair of the holes 23 and 24 being arranged on the diagonal of one block.

Then an In film was formed all over by means of a conventional deposition method. The In film was partly lifted off, using a photo-resist film, to form an In pattern to be n-side electrode pads 31 and p-side electrode pads 32. The wafer was heat-treated at 250° C. for about 30 minutes to cause the n-side and p-side electrode pads 31 and 32 to be ohmic electrodes.

Figure 3:
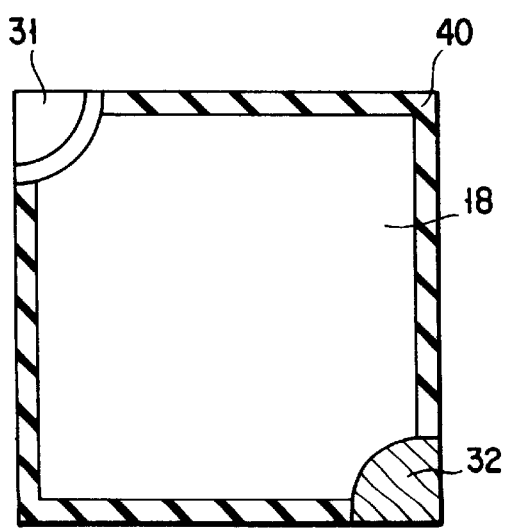
FIG. 3 is a horizontally sectional plan view showing the light-emitting diode according to the first embodiment.

Then the sapphire substrate 11 was mirror-polished to have a thickness of 80 μm, and the wafer was cut along the grooves 22 of 20-μm width and divided into chips of about 350-μm square. FIG. 3 shows a plan view showing one chip thus cut out. In FIG. 2, a portion surrounded by a broken line corresponds to this one chip. The rectangular chip is provided with the n-side electrode pad 31 at its one corner and the p-side electrode pad 32 at another corner diagonally opposite thereto.

Figure 4:
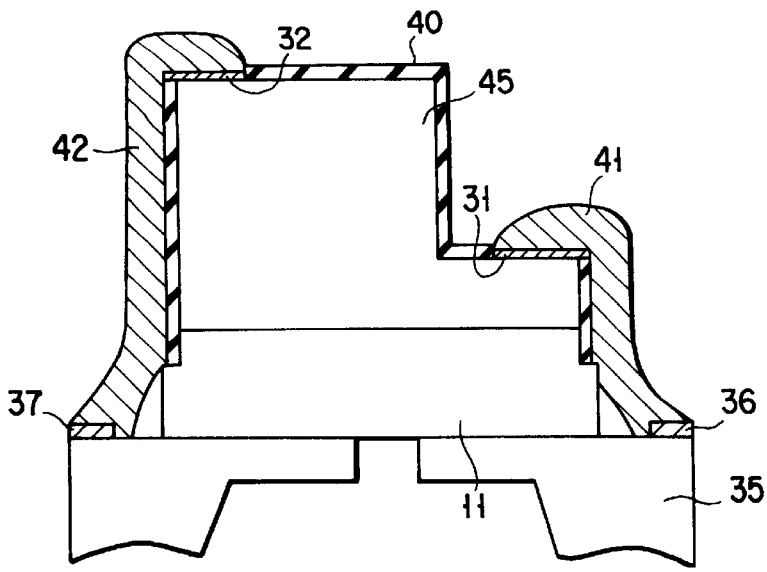
FIG. 4 is a vertically-sectional side view showing a state where the light-emitting diode according to the first embodiment is attached to a mount frame.

Then, the chip was attached to a mount frame (outer frame) 35 having a pair of mount electrode pads 36 and 37 as n-side and p-side electrodes. The electrode pads 31 and 32 of the chip were electrically connected to the mount electrode pads 36 and 37 by In solder. The In solder was applied such that it flowed down from the electrode pads 31 and 32 to the mount electrode pads 36 and 37. With this operation, In wiring layers 41 and 42 were formed on the insulating film 40 of $SiO_2$ and the like covering the multi-layer structure 45 of the GaN-based semiconductors, as shown in FIG. 4.

The semiconductor light-emitting device, i.e., light-emitting diode, arranged on the mount frame 35 by means of the above-described method has a light-output face facing up. The multi-layer structure 45 of the GaN-based semiconductors defining the light-output face is constituted by a plurality of semiconductor layers 12 to 18 stacked on the sapphire substrate 11 in a vertical direction to form a pn junction for light-emitting in the light-emitting layer 15.

The n-side and p-side electrode pads 31 and 32, which basically do not transmit the emitted light, are arranged on the n-type and p-type GaN contact layers 14 and 18, respectively, which interpose the light-emitting layer 15. The total projected area of the electrode pads 31 and 32 is set at 25% or less of the projected area of the light-output face in the plan view of the light-output face.

Most of the side surfaces and the light-output face of the multi-layer structure 45 are covered by the insulating film 40 of $SiO_xN_y$ (x+y≠0, 0≦x, 0≦y), such as $SiO_2$ or the like, which transmits the emitted light. The electrode pads 31 and 32 of the chip and the mount electrode pads 36 and 37 are electrically connected only by the In wiring layers 41 and 42, respectively, formed on the insulating film 40.

The light-emitting diode having such features allows the ratio of the electrode pads 31 and 32 in occupying the area of the light-output face to be decreased. In an experiment, when the orientation angle was set at 8° C., the axial light intensity was 1.5 cd on average. Further, since the electrode pads 31 and 32 were electrically connected to the mount frame by the solder wiring layers 41 and 42, rather than wire-bonding, hardly any inconvenience was caused in spite of the small sizes of the electrode pads 31 and 32. In this respect, the wiring layers 41 and 42 preferably consist essentially of a metal material having a melting point of from 150° C. to 350° C.

Figure 5:
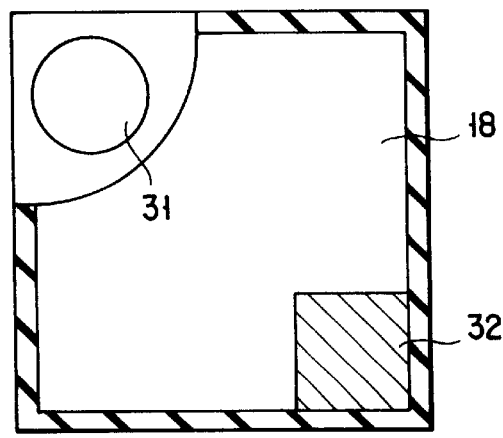
FIG. 5 is a horizontally sectional plan view showing a comparative device in relation to the first embodiment.

FIG. 5 shows a comparative example relative to this embodiment. In this comparative example, a circular electrode pad 31 of 120-μm diameter and an electrode pad 32 of 120-μm square were arranged on an n-type GaN layer 14 and a p-type GaN layer 18, respectively. In this device, when the orientation angle was set at 8° C., the axial light intensity was 1 cd on average.

In this embodiment, the total projected area of the electrode pads is set at 25% or less of the projected area of the light-output face, i.e., the projected area of the light-emitting region is set at 75% or more of the projected area of the light-output face, because of the following reason.

In most devices using an insulating substrate as a support, p-side and n-side electrodes are arranged on the same face. For this reason, it is necessary to perform etching or the like to arrange at least one of the electrodes. The etching or the like brings about a step portion having a side surface which causes some of the characteristics of the devices to lower. For example, since an electrode is arranged along the edge of the step, the main part of an electric field extremely concentrates on the step, thereby greatly deteriorating device characteristics, e.g., lowering the light-emitting characteristic of the device, and shortening the life of the device. In order to solve this problem, it is preferable to decrease the electrode area and make step boundary portions small as far as possible. In an experiment conducted by the present inventors, the characteristic deterioration was prevented in an LED of 300-μm square, where the etched area was at most about 20% of the whole area, and especially about 10% with a great effect. In other words, where the p-side and n-side electrodes occupied about 20% area relative to the whole area, the characteristic deterioration was not observed.

Further, the most influential part of the p-side and n-side electrodes, in lowering the light-emitting characteristic, is electrode portions incapable of transmitting the emitted light, such as ones generally called electrode pads. Transparent electrode portions capable of transmitting the emitted light have little influence on the light-emitting characteristic. In this respect, it has been found by an experiment that the light-emitting characteristic is improved by setting the projected area of electrode portions incapable of transmitting the emitted light to be at 25% or less of the projected area of the light-output face in the plan view of the light-output face, and by specifically arranging these electrode portions.

It has also been found that decreasing the size of the electrode pads facilitates improvement of the device characteristics, more than decreasing the size of the etched step portions does, where the device has a size such that its one side is less than 150 μm.

An explanation will be given on the function of this embodiment with reference to FIGS. 6 and 7.

Figures 6A, 6B:
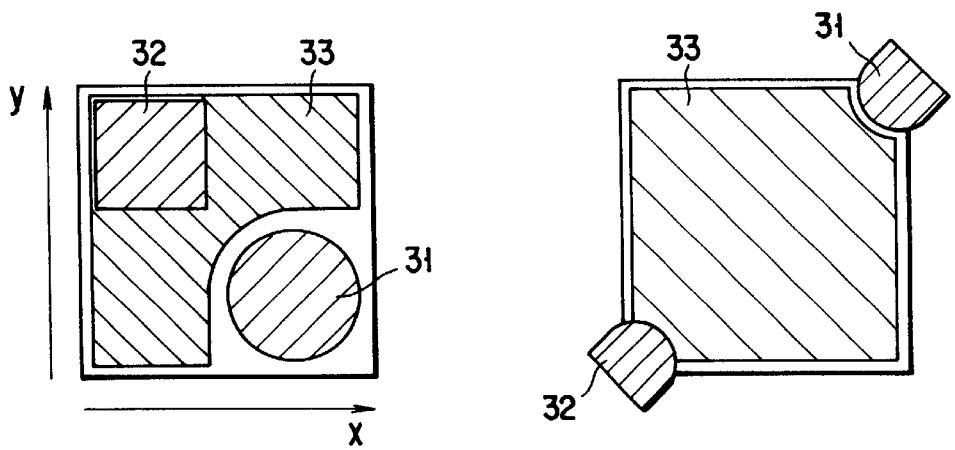
FIGS. 6A and 6B are views showing the plan layouts of a conventional device and the device according to the first embodiment, respectively.
Figure 7A:
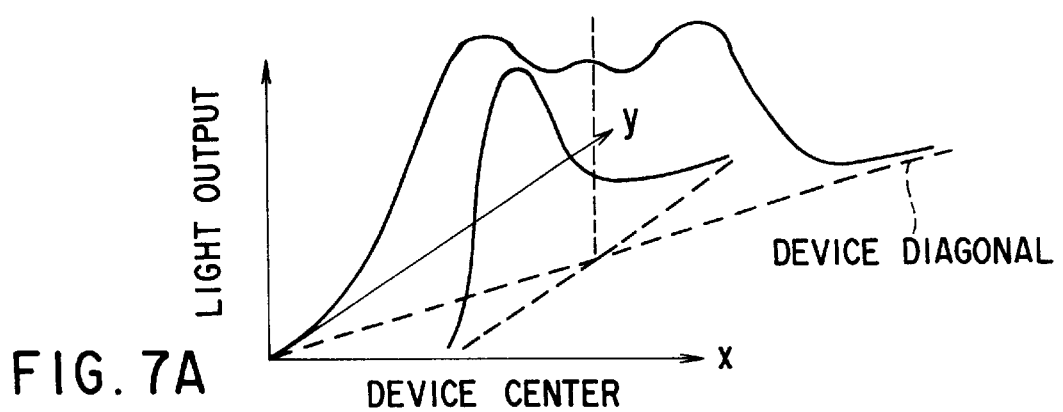
FIGS. 7A and 7B are views showing the light-emitting patterns of the conventional device and the device according to the first embodiment, respectively.
Figure 7B:
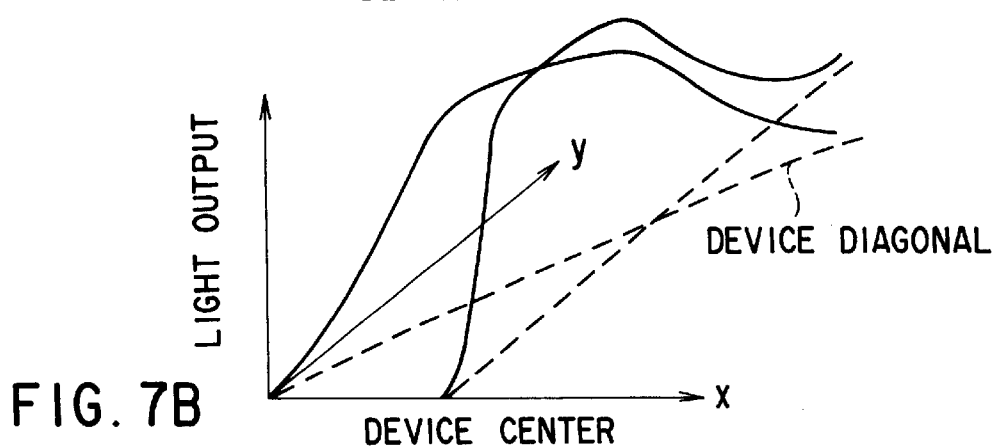

FIGS. 6A and 6B are views showing the plan layouts of a conventional device and the device according to this embodiment, respectively. FIGS. 7A and 7B are views showing the light-emitting patterns of the conventional device and the device according to this embodiment, respectively.

In an electrode pattern shown in FIG. 6A, its light-emitting region 33 is divided, thereby ending up with a characteristic of a light-emitting pattern as shown in FIG. 7A. On the other hand, in an electrode pattern shown in FIG. 6B, light is emitted concentrically about the center of its light-emitting region 33, thereby presenting a characteristic of a light-emitting pattern as shown in FIG. 7B. The electrode pattern of this embodiment, therefore, can ease lens system design and improve the light-emitting characteristic. Further, unlike the conventional electrode pattern, since the inter-electrode distances in the electrode pattern of this embodiment are relatively constant, local electric concentration is prevented and the device's life is prolonged.

As described above, according to this embodiment, the light-emitting efficiency is improved by decreasing the electrode area and increasing the light-emitting area. In addition to this, the light-emitting pattern characteristic is also improved. As a result, a light-emitting diode with high brightness can be realized. On the other hand, improvement in the light-emitting efficiency allows each chip to be smaller, where the light intensity remains the same as in the conventional one. It follows that the number of chips to be fabricated and cut out from one wafer can be increased, thereby lowering the manufacturing cost.

Figure 8:
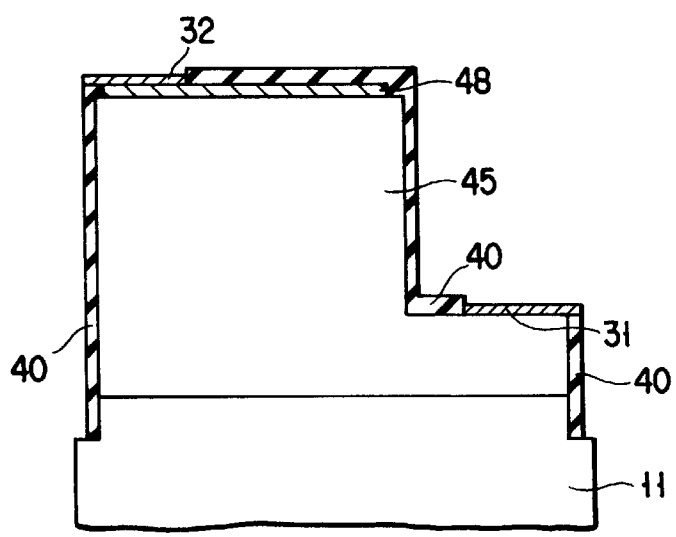
FIG. 8 is a vertically-sectional side view showing a first modification of the device according to the first embodiment.

FIG. 8 is a vertically-sectional side view showing a first modification of the device according to the first embodiment. In this modification, a p-side electrode pad 32 is arranged not to be in direct-contact with a p-type layer, but to be in contact therewith via transparent conductive film 48, such as ITO, which transmits the emitted light. With this arrangement, the light intensity of the device can be further increased.

FIG. 9 is a horizontally sectional plan view showing a second modification of the device according to the first embodiment. In this modification, a p-side electrode pad 32 has extending portions along two sides of a light-output face which are adjacent thereto, in addition to the electrode arrangement of the first embodiment. In other words, the p-side electrode pad 32 does not stay only at one corner, but extends to the corners where no n-side electrode pad 31 is disposed.

This arrangement allows electric current to expand so that light is uniformly emitted from a broader region, without using the transparent conductive film or the like.

SECOND EMBODIMENT

FIG. 10 is a view showing the plan layout of a light-emitting diode according to a second embodiment of the present invention. This embodiment employs four electrode pads 51, 52, 53, and 54 disposed on the four corners of the device, respectively. In such an arrange- ment, it is preferable that the diagonally opposite two of the electrode pads are used as electrode for the same layer, i.e., as shown in FIG. 10, the electrode pads 51 and 53 are for a p-type layer while the electrode pads 52 and 54 are for an n-type layer.

However, this concept requires a complicated structure having, for example, n-side and p-side frames 61 and 62 as shown in FIG. 11, and entails a problem in productivity. Accordingly, three of the electrode pads may be used for the p-type layer while one for the n-type layer, or the electrode pads 51 and 52 may be used as a p-side electrode while the electrode pads 53 and 54 as an n-side electrode. These alternatives are preferable to simplify the frame structure.

THIRD EMBODIMENT

FIG. 12 is a horizontally sectional plan view showing a light-emitting diode according to a third embodiment of the present invention. This embodiment employs four electrode pads 71, 72, 73, and 74 disposed on the four corners of the device, respectively, and one electrode 70 arranged at the center. Either of the electrode pad 70 and the group of the electrode pads 71 to 74 is used as a p-side electrode and the other is as an n-side electrode. The central electrode pad 70 preferably has a diameter of 120 µm or less, more preferably 80 µm or less.

This embodiment is advantageous because of its relatively good symmetric arrangement, as compared to the first and second embodiments in which electric current intensity has a non-uniform distribution and thus light-emitting intensity also has a non-uniform planar distribution.

FOURTH EMBODIMENT

Figure 13:
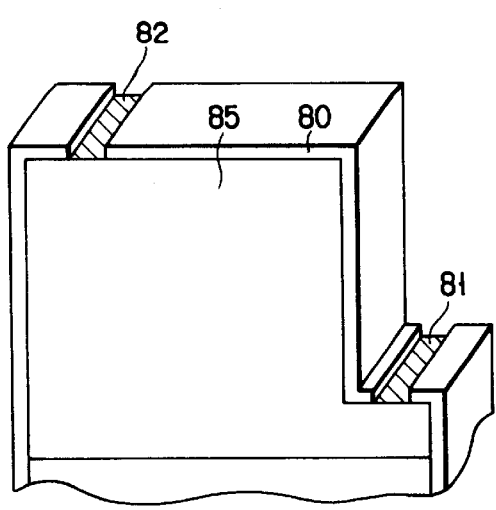
FIG. 13 is a perspective view showing a light-emitting diode according to a fourth embodiment of the present invention.

FIG. 13 is a perspective view showing a light-emitting diode according to a fourth embodiment of the present invention. This embodiment is conceived to cause electric current to uniformly flow by disposing an n-side electrode (electrode pad) 81 and a p-side electrode (electrode pad) 82 parallel to each other. In FIG. 13, there are further shown an insulating film 80 of $SiO_2$ and the like, and a multi-layer structure 85 of GaN-base materials.

It is preferable to set the width of each electrode at 20 µm or less in this embodiment. With this condition, a region to be etched to expose an n-type layer is about 40 µm wide or less, so that the light-emitting area is not so decreased. Instead of the p-side electrode 82 having a width of 20 µm, a transparent conductive film may be formed all over the p-type layer.

Figure 14:
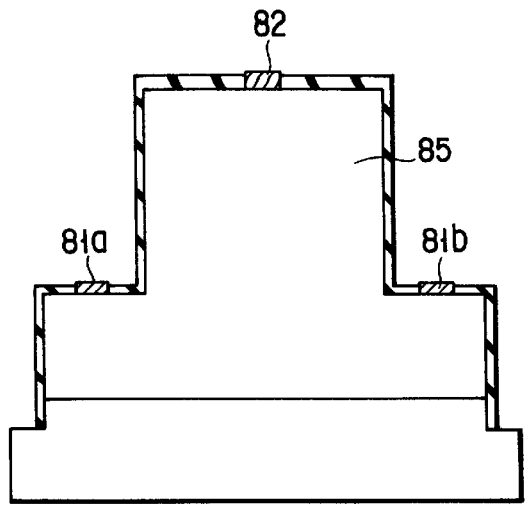
FIG. 14 is a vertically-sectional side view showing a modification of the device according to the fourth embodiment.

FIG. 14 is a vertically-sectional side view showing a modification of the device according to the fourth embodiment. In this modification, electrode pads 81a and 81b constituting an n-side electrode 81 are arranged on opposite sides of the device, and an electrode pad, i.e., p-side electrode 82 is arranged at the center, each of them being formed as a line having a width of 10 µm. Where the device is mounted on a mount frame, the upper electrode is used as the p-side while the lower electrode as the n-side, as shown in FIG. 14.

Figure 15:
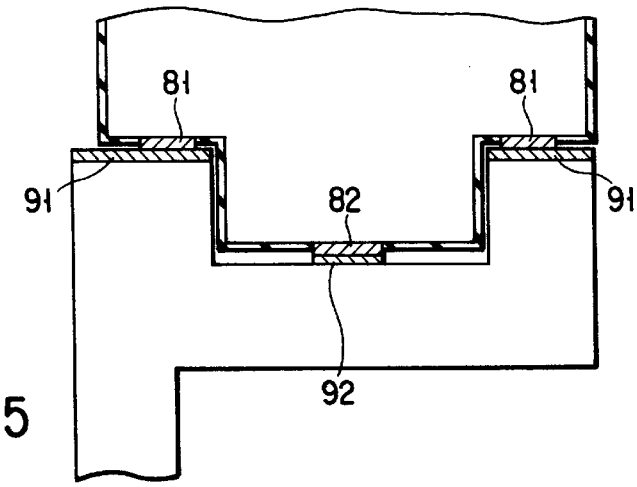
FIG. 15 is a vertically-sectional side view showing a state where the light-emitting diode of the modification according to the fourth embodiment is attached to a mount frame.

In the above described embodiments and their modifications, the electrode face is arranged on a side opposite to a mount frame, and, therefore, is visible on the upper side of a general light-emitting diode lamp. However, where a transparent substrate, such as sapphire, is used, the electrode face may be arranged to face the mount frame. For example, this is realized for the structure shown in FIG. 14 by preparing a mount frame having step portions and mounting the chip thereon, as shown in FIG. 15. In other words, the mount frame is formed in accordance with the shape of the chip, and is provided with electrode pads 91 and 92, so that the chip is connected face-down.

Note that, in this case, an insulating protection film should be appropriately formed to prevent a pn junction from being short-circuited due to solder creeping up.

FIFTH EMBODIMENT

Figure 16:
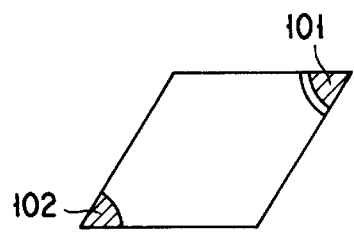
FIG. 16 is a view showing the plan layout of a light-emitting diode according to a fifth embodiment of the present invention.

FIG. 16 is a view showing the plan layout of a light-emitting diode according to a fifth embodiment of the present invention.

A sapphire substrate is apt to crack easily in <11–20> directions, but relatively little in <1–100> directions perpendicular thereto. For this reason, it is preferable to divide the sapphire substrate in the <11–20> directions which exist every 60°, so that the substrate is efficiently divided. In a light-emitting device arranged on a sapphire substrate having a rhombus shape, its electrode area is decreased by disposing electrodes (electrode pads) 101 and 102 on the longer diagonal, i.e., on the acute-angled corners of the rhombus shape. In this case, since electric current spreads more easily than in a rectangular shape, light is uniformly emitted.

Note that the present invention is not limited to the above described first to fifth embodiments. Namely, although In is used as a material of the electrode pads in the embodiments, other materials may be used. For example, as an electrode pad on a p-type layer, a single layer of In, Al, Pt, Ti, Ni, Mg, Zn, Be, Ge, Pd, Sn, or Au, or multi-layer or alloy of these metals may be used. On the other hand, as an electrode pad on an n-type layer, a single layer of In, Ti, Al, Ag, Cr, Ge, Sn, or Au, or multi-layer or alloy of these metals may be used.

Further, the multi-layer structure of a light-emitting device is not limited to the structure shown in FIG. 1. For example, as a light-emitting layer, a multi-quantum well (MQW) structure, single-quantum well (SQW) structure, or such a structure doped with an appropriate amount of impurity may be used. As a substrate for growing semiconductor layers, another plane of sapphire, such as an M, A, or R plane may be used, or an oxide, such as spinel ($MgAl_2O_4$), or an fluoride, such $CaF_2$, may be used.

Furthermore, a semiconductor multi-layer structure stacked on a substrate may be formed of Group III–V compound semiconductors or Group II–VI compound semiconductors, in place of the GaN-based compound semiconductors. As a film formation method, a molecular beam epitaxy (MBE) method or a CVD method using a hydride or chloride material may be used, in place of the MOCVD method. Besides, the first to fifth embodiments may be modified in various manners.

SIXTH EMBODIMENT

An explanation will be given on an embodiment applied to a semiconductor laser device.

Figure 17:
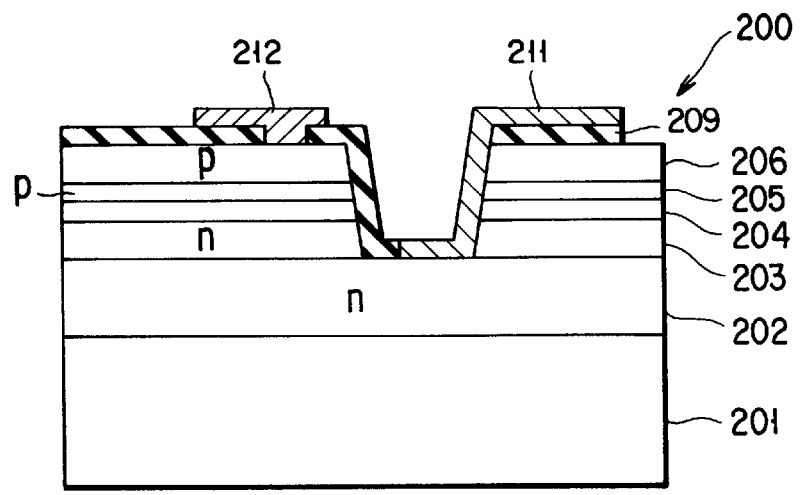
FIG. 17 is a vertically-sectional side view showing a semiconductor laser device according to a sixth embodiment of the present invention.

FIG. 17 is a vertically-sectional side view showing a semiconductor laser device 200 according to a sixth embodiment of the present invention. This embodiment will be described with reference to FIGS. 18A to 18D showing its manufacturing steps.

Figures 18A, 18C:
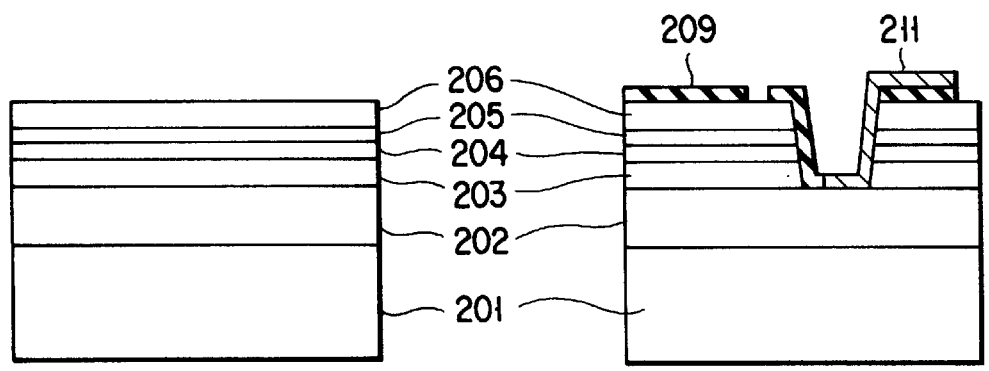
FIGS. 18A to 18D are vertically-sectional side views showing the order of the steps of a method of manufacturing the semiconductor laser device according to the sixth embodiment.

As shown in FIG. 18A, GaN-based materials were stacked by means of an MOCVD (Metal Organic Chemical Vapor Deposition) method on a sapphire substrate having a C-plane main surface to form a multi-layer structure constituting a laser cavity (oscillator). First, after a GaN buffer was deposited, an n-type GaN contact layer 202, an n-type GaAlN cladding layer 203, an InGaN active layer 204, a p-type GaAlN cladding layer 205, and a p-type GaN contact layer 206 were stacked in this order. Although the MOCVD method was used to grow the crystals in this embodiment, another crystal growing method, such as an MBE method may be used.

Figure 18B:
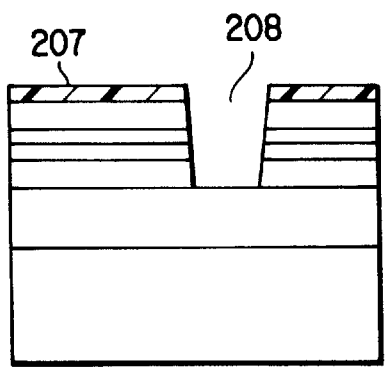

Then, as shown in FIG. 18B, a resist pattern 207 was formed by means of photo-lithography. Then, using the resist pattern 207 as a mask, an RIBE (Reactive ion beam etching) was performed with $Cl_2$ gas to form a groove 208 in the multi-layer structure. The groove 208 was formed to penetrate the p-type GaN contact layer 206, p-type GaAlN cladding layer 205, InGaN active layer 204, and n-type GaAlN cladding layer 203, so as to reach n-type GaN contact layer 202.

After the etching mask 207 was removed, an $SiO_2$ film 209 was deposited all over the wafer, as shown in FIG. 18C. Then, a resist pattern was formed by means of photo-lithography, and, using the resist pattern as a mask, the $SiO_2$ film 209 was etched to form an opening for an n-side electrode at the bottom of the groove 208. Further, the n-side electrode and an electrode pad 211 connected thereto were formed by means of a lift-off method using a resist, and an oblique incident vapor deposition method.

Figure 18D:
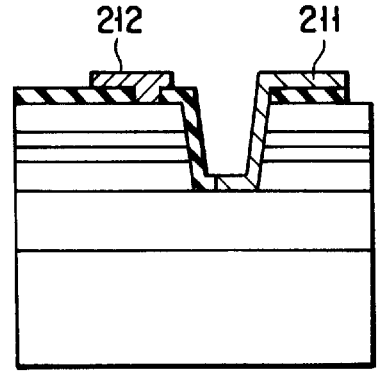

Then, as shown in FIG. 18D, a resist pattern was formed by means of photo-lithography, and, using the resist pattern as a mask, the $SiO_2$ film 209 was selectively etched to expose the p-type GaN layer 206. Then, an electrode metal was vapor-deposited and partly removed by means of a lift-off method to form a p-side electrode and an electrode pad 212 connected thereto.

According to this embodiment, the n-side electrode pad 211 and the p-side electrode pad 212 are arranged on the same horizontal plane. In other words, the n-side electrode is formed at the bottom of the groove, while the n-side electrode pad 211 connected thereto is formed on a mesa having the same height as a surface on which the p-side electrode pad 212 is formed.

Conventionally, laser devices employ p-side and n-side electrode pads which are arranged on different levels above a semiconductor substrate, and thus require compensation for the height difference between the p-side and n-side electrode pads. This is performed by, for example, arranging p-side and n-side electrode pads of a mount frame, such as a heat sink, on different levels, or increasing the thickness of one of the connecting solder layers. In such a method, a problem arises such that a mounting operation of the device onto the heat sink is not so easy, or the electrodes are short-circuited due to inflow of the thick solder.

In contrast, a semiconductor laser device of gallium nitride compound semiconductors according to the embodiment, the p-side and n-side electrode pads are arranged on the same plane. As a result, the amount of the connecting solder relative to a heat sink can be reduced. Further, since a mounting operation of the device onto the heat sink becomes easy, it is possible to decrease device malfunction caused by short-circuiting at electrode connecting portions when the device is mounted.

Figure 19:
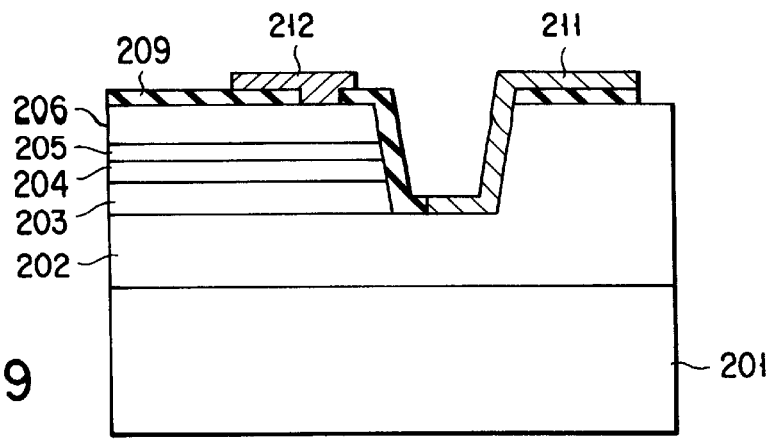
FIG. 19 is a vertically-sectional side view showing a modification of the device according to the sixth embodiment.

Note that, other than the laser device of an electrode strip structure described above, this embodiment can be easily applied to a laser device of another type, such as an internal electric constriction structure. Besides, as shown in FIG. 19, the n-side electrode pad 211 may be arranged above a mesa formed of the n-type GaN contact layer 202.

SEVENTH EMBODIMENT

Figure 20:
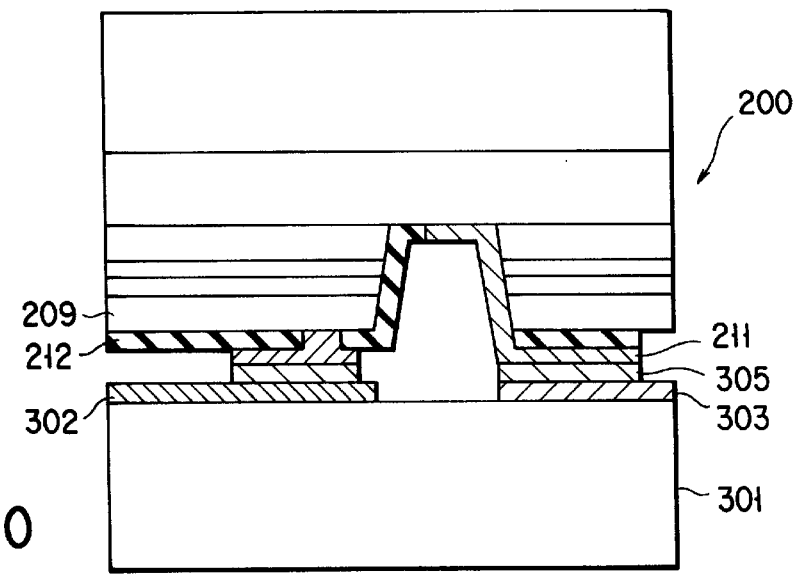
FIG. 20 is a vertically-sectional side view showing a state where the semiconductor laser device shown in FIG. 17 is attached to a mount frame according to a seventh embodiment.

FIG. 20 is a vertically-sectional side view showing a state where the semiconductor laser device 200 shown in FIG. 17 is attached to a mount frame 301 according to a seventh embodiment.

Figures 21A, 21B:
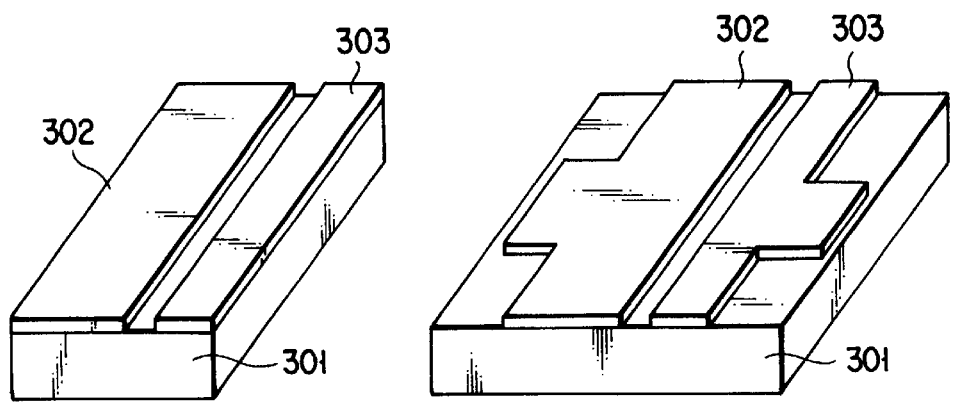
FIGS. 21A and 21B are perspective views showing the mount frame according to the seventh embodiment and a modification thereof, respectively.

As shown in FIG. 20, the semiconductor laser device 200 as described in the sixth embodiment was mounted on the mount frame 301, such as a heat sink, junction-down. FIG. 21A shows the mount frame 301 according to this embodiment.

The mount frame 301 was provided with an n-side electrode pad 303 and a p-side electrode pad 302 formed on the same plane with a distance therebetween almost the same as the electrode distance of the semiconductor laser device 200 to be mounted. Solder materials were vapor-deposited on the electrode pads 302 and 303 beforehand. Then, the semiconductor laser device 200 was connected to the mount frame 301 junction-down.

This embodiment is characterized in that the p-side and n-side electrode pads of each of the semiconductor laser device 200 and the mount frame 301 are arranged on the same plane, and in that the laser device 200 was mounted on the mount frame 301 junction-down.

Conventionally, such a mount frame requires a step portion to arrange p-side and n-side electrode pads at different height levels in accordance with height levels of the electrode pads of a semiconductor laser device to be mounted. In this method, the step portion of the mount frame and the step portion of the laser device have to be aligned with high accuracy, thereby causing a mount operation to be complicated. Further, one of the connecting solder layers need to be thick, and thereby causes problems such that the solder is less adhered or brings about a short-circuiting to deteriorate device characteristics. In contrast, the present embodiment does not require such alignment with high accuracy for the mounting operation.

Note that the electrode pads can be shaped in various fashions, and, for example, may be provided with pad portions for wire-bonding, as shown in FIG. 21B.

EIGHTH EMBODIMENT

Figure 22:
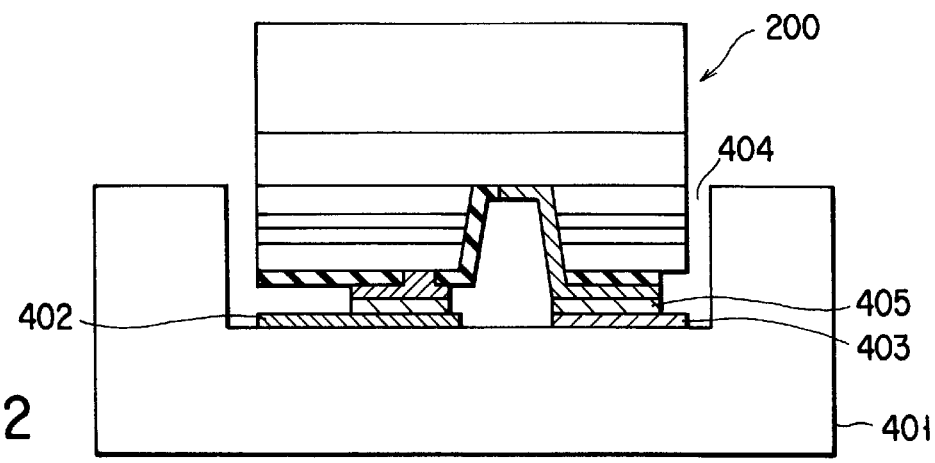
FIG. 22 is a vertically-sectional side view showing a state where the semiconductor laser device shown in FIG. 17 is attached to a mount frame according to an eighth embodiment.

FIG. 22 is a vertically-sectional side view showing a state where the semiconductor laser device 200 shown in FIG. 17 is attached to a mount frame 401 according to an eighth embodiment.

The mount frame 401 is provided with a groove 404 wider than the width of the semiconductor laser device 200 to be mounted, and electrode pads 402 and 403 at the bottom of the groove 404. The laser device 200 is mounted in the groove 404 formed on the mount frame 401 junction-down. The groove 404 functions as a guide when the laser device 200 is being arranged on the mount frame 401. With this guide, the electrode pads on the laser device 200 and the electrode pads on the mount frame 401 can be aligned with high accuracy.

Figures 23A, 23B:
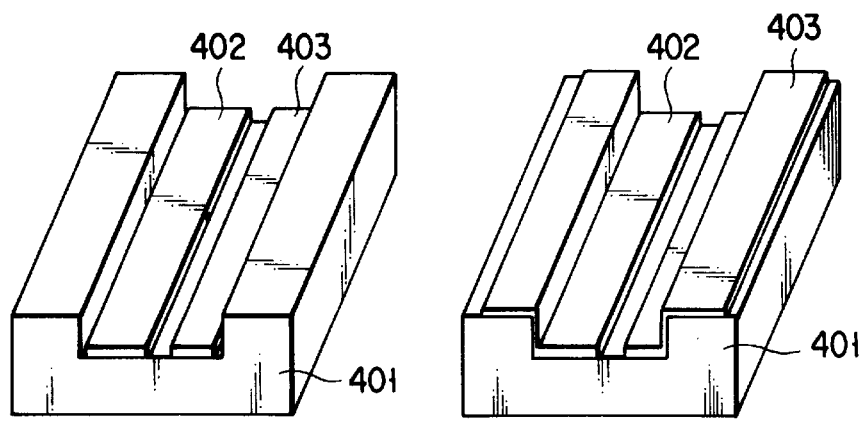
FIGS. 23A to 23D are perspective views showing the mount frame according to the eighth embodiment and modifications thereof, respectively.
Figures 23C, 23D:
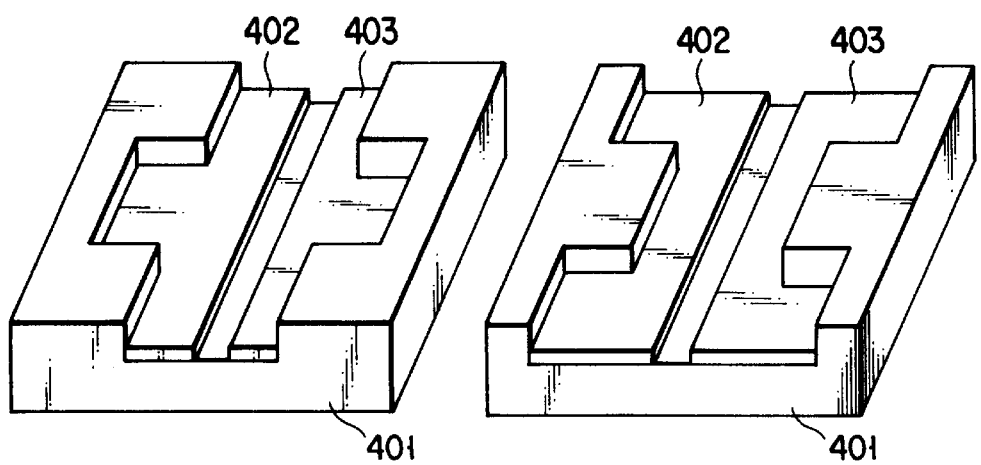

This embodiment employs the mount frame having the groove and the electrode pads shown in FIG. 23A, but may instead employ any one of the mount frames shown in FIGS. 23B to 23D.

NINTH EMBODIMENT

Figure 24:
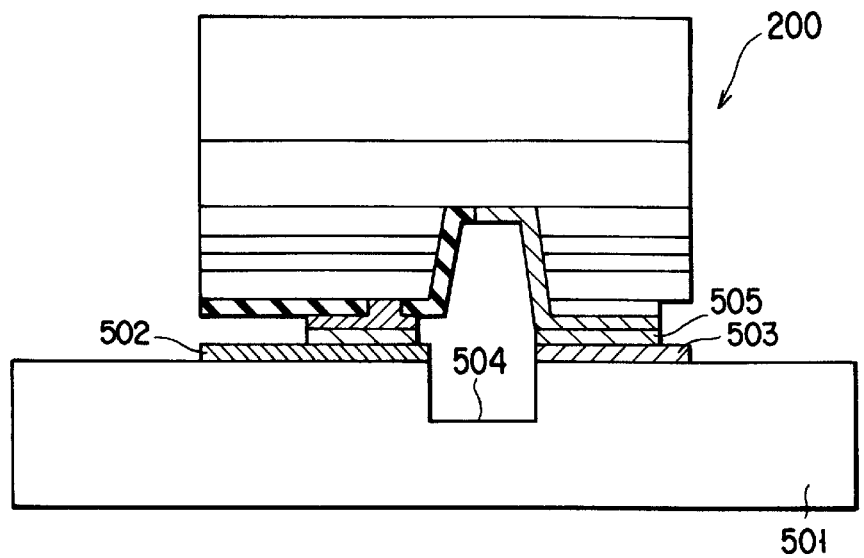
FIG. 24 is a vertically-sectional side view showing a state where the semiconductor laser device shown in FIG. 17 is attached to a mount frame according to a ninth embodiment.

FIG. 24 is a vertically-sectional side view showing a state where the semiconductor laser device 200 shown in FIG. 17 is attached to a mount frame 501 according to a ninth embodiment.

The mount frame 501 is provided with n-side and p-side electrode pads 503 and 502 arranged on the same plane. Between the electrode pads 502 and 503, there is a groove 504 narrower than the width of the laser device 200 to be mounted. The laser device 200 is mounted on electrode pads arranged on the mount frame 501 junction-down. With this groove, the electrode pads on the laser device 200 and the electrode pads on the mount frame 501 can be connected with high accuracy. The groove 504 formed between the electrode pads on the mount frame 501 hinders solder in flowing from one of the electrode pads to the other, thereby preventing short-circuiting, when the laser device 200 is mounted.

Figure 25A:
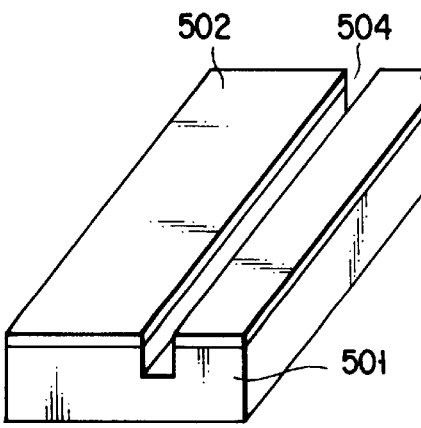
FIGS. 25A and 25B are perspective views showing the mount frame according to the ninth embodiment and a modification thereof, respectively.
Figure 25B:
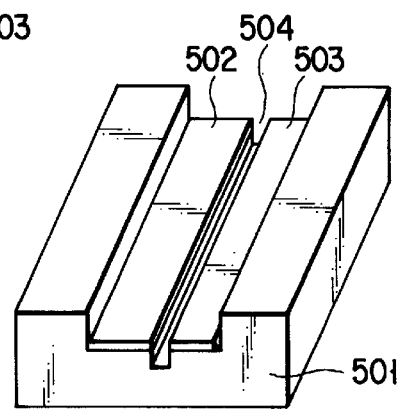
Figure 26:
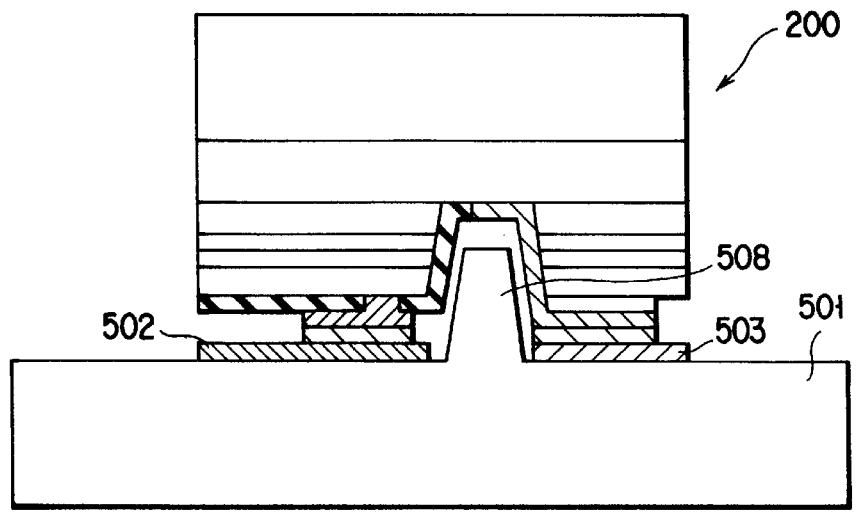
FIG. 26 is a vertically-sectional side view showing a state where the semiconductor laser device shown in FIG. 17 is attached to a modification of the mount frame according to the ninth embodiment.

This embodiment employs the mount frame having the groove and the electrode pads shown in FIG. 25A, but may instead employ a mount frame shown in FIG. 25B. Further, as shown in FIG. 26, a mount frame having a projecting portion 508 at a position corresponding to the groove 504 may be used.

10th EMBODIMENT

Figure 27:
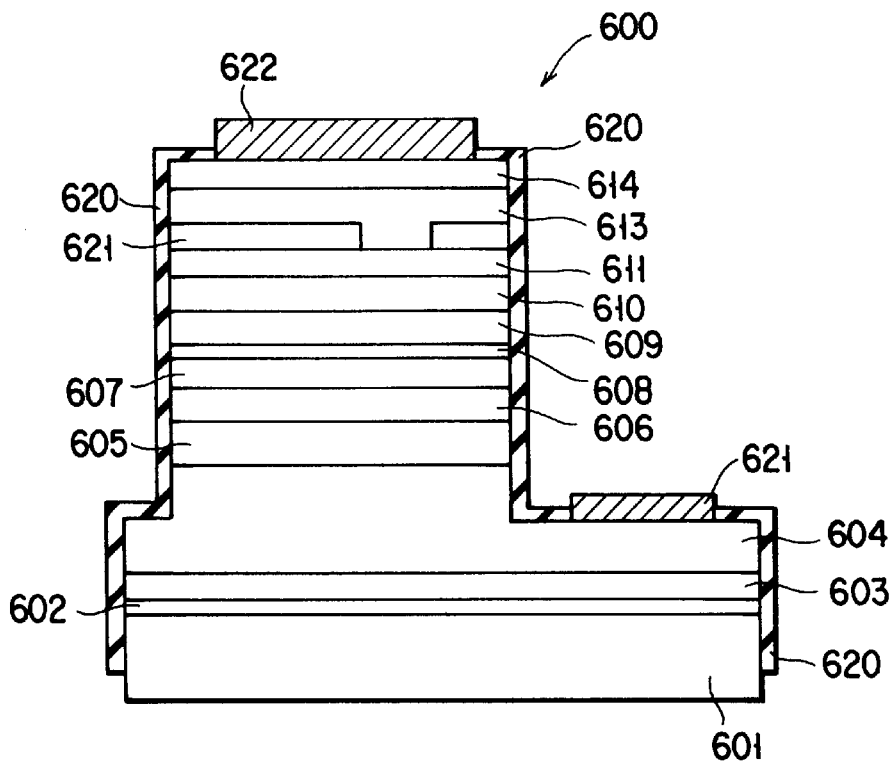
FIG. 27 is a vertically-sectional side view showing a Group III nitride semiconductor laser device according to a 10th embodiment of the present invention.

FIG. 27 is a vertically-sectional side view showing a Group III nitride semiconductor laser device 600 according to a 10th embodiment of the present invention.

The semiconductor laser device 600 has an insulating substrate 601, e.g., sapphire substrate having a C-plane main surface and a thickness of about 60 μm. On the sapphire substrate 601, a multi-layer structure of GaN-based semiconductors as described below is arranged.

First, a GaN buffer layer 602, a GaN quality-improving layer 603, and an n-type GaN contact layer 604 are arranged on the substrate 601 in this order. On the contact layer 604, except for a region on which an n-side electrode 632 is arranged, an n-type AlGaN cladding layer 605 having a 7%-Al composition, an n-type GaN guide layer 606, an active layer 607 of a multi-quantum well structure (MQW), a p-type AlGaN overflow-preventing layer 608 having a 25%-Al composition, a p-type guide layer 609, a p-type AlGaN cladding layer 610 having a 7%-Al composition, and a p-type GaN first contact layer 611 are arranged in this order. On the contact layer 611, an n-type current-blocking layer 612 having an opening to form a current-constriction structure is arranged, and there are further a p-type GaN second contact layer 613 covering the blocking layer 612, and a p-type GaN third contact layer 614 having a high-impurity concentration arranged at the top.

An SiO$_2$ insulating film 620 is arranged to cover the side surface from the n-type contact layer 604 to the p-type third contact layer 614. An n-side electrode (electrode pad) 621 and a p-side electrode (electrode pad) 622 are arranged on the n-type contact layer 604 and the p-type third contact layer 614, respectively. The n-side electrode 621 has a structure in which a Ti layer and an Au layer are stacked on the n-type contact layer 604 in this order, while p-side electrode 622 has a structure in which a Pt layer, a Ti layer, a Pt layer, and an Au layer are stacked on the p-type third contact layer 614 in this order.

A GaN-based semiconductor laser device having such a structure requires electric current to concentrate in the active layer. For this reason, the semiconductor laser device greatly differs in electric density from a light-emitting diode, even if their current flow rates are the same. Since heat generation is decided by a product of voltage and current, the GaN-based semiconductor laser device has a large heat generation rate.

As means for supplying electric current, a bonding wire generally using Au or the like is known. However, it is difficult to efficiently discharge heat generated in the active layer through such a wire having a small sectional area. On the other hand, a multi-layer structure of GaN-based semiconductor is generally formed on a sapphire substrate, but an insulating material, such as sapphire, has a low thermal conductivity, and thus hardly allows heat to be discharged therethrough. In addition, the active layer generates heat the most and is located relatively far from the substrate. Accordingly, it is further difficult to discharge heat generated in the active layer through the substrate.

Figure 28:
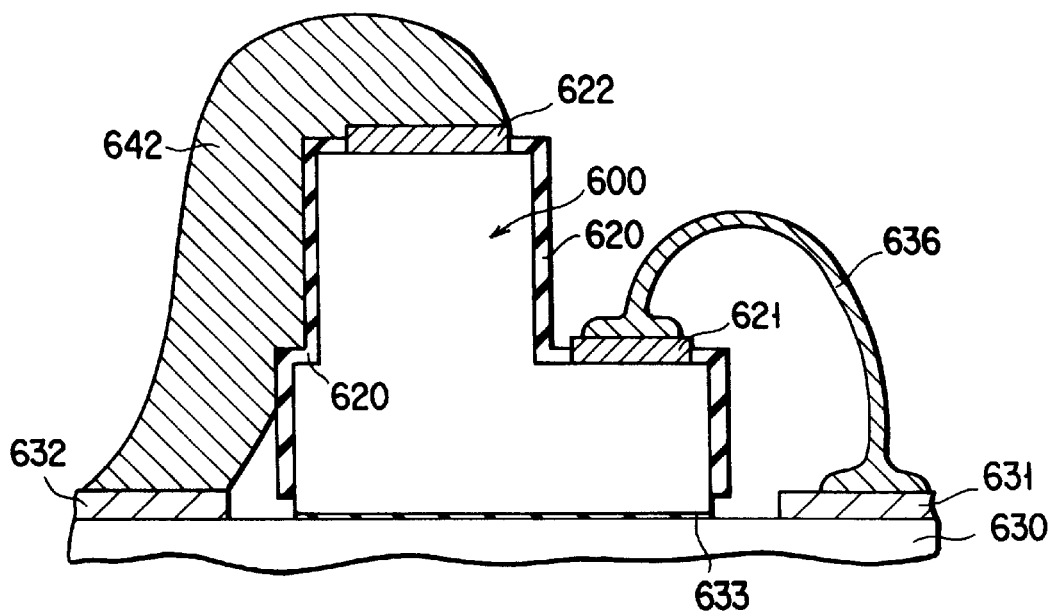
FIG. 28 is a vertically-sectional side view showing a state where the semiconductor laser device shown in FIG. 27 is attached to a mount frame.

FIG. 28 is a vertically-sectional side view showing a state where the semiconductor laser device 600, i.e., a chip, shown in FIG. 27 is attached to a mount frame 630, from the above-described point of view.

The mount frame 630 is generally flat and is provided with a pair of mount electrode pads 631 and 632 as n-side and p-side electrodes, one on either side. The device (chip) 600 is fixed to the mount frame 630 by an adhesive layer 633. The n-side electrode (electrode pad) 621 of the device 600 and the mount electrode pad 631 corresponding thereto are electrically connected through a conventional bonding wire 636.

On the other hand, the p-side electrode (electrode pad) 622 of the device 600 and the mount electrode pad 632 corresponding thereto are electrically connected through an In wiring layer 642 arranged on the insulating film 620. The In wiring layer 642 has a thickness larger than that of the electrode pad 622, so that the layer 642 functions as a heat-discharging member for discharging heat generated in the multi-layer structure of GaN-based semiconductors, especially, in the active layer 607 and at the interface between the p-side electrode 622 and the p-type layer 614.

The In wiring layer 642 is formed by applying, i.e., giving a coat of, an In solder from the electrode pad 622 to the electrode pad 632.

As a solder material for forming the wiring layer 642, a metal, such as Au or Sn, an alloy of these metals, a resin containing Ag, or a conductive oxide, such as ITO, may be used other than In.

Figure 29:
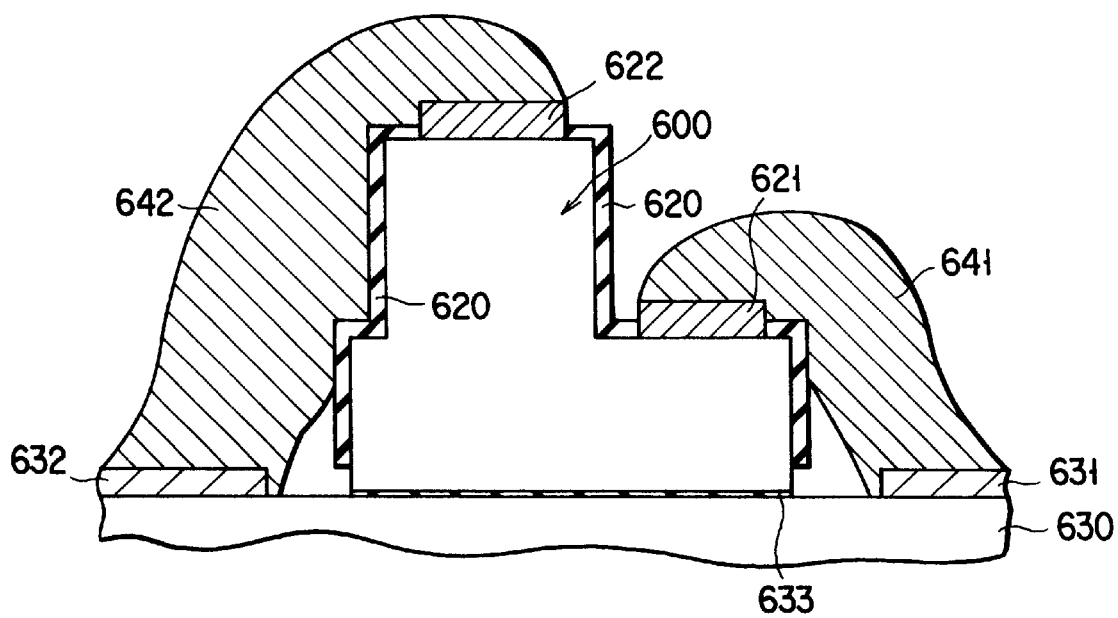
FIG. 29 is a vertically-sectional side view showing a modification of the structure according to the 10th embodiment.

FIG. 29 is a vertically-sectional side view showing a modification of the structure according to the 10th embodiment.

In this modification, an n-side electrode (electrode pad) 621 of the device 600 and the mount electrode pad 631 corresponding thereto are electrically connected also through an In wiring layer 641 arranged on the insulating film 620, as well as the p side. The In wiring layer 641 has a thickness larger than that of the electrode pad 621, so that the layer 641 functions as a heat-discharging member. The In wiring layer 641 is formed by applying, i.e., giving a coat of, an In solder from the electrode pad 621 to the electrode pad 631.

Heat generation of the semiconductor laser device 600 is mostly performed in the active layer 607 and at the interface between the p-side electrode 622 and the p-type layer 614. For this reason, it is advisable to discharge heat from the p-side electrode 622 which is closer to these heat sources. However, since there is some heat source even on the n-side, a heat-discharging member structure arranged in the n-side wiring layer 641, as in the p-side, can work to some extent.

11th EMBODIMENT

Figure 30:
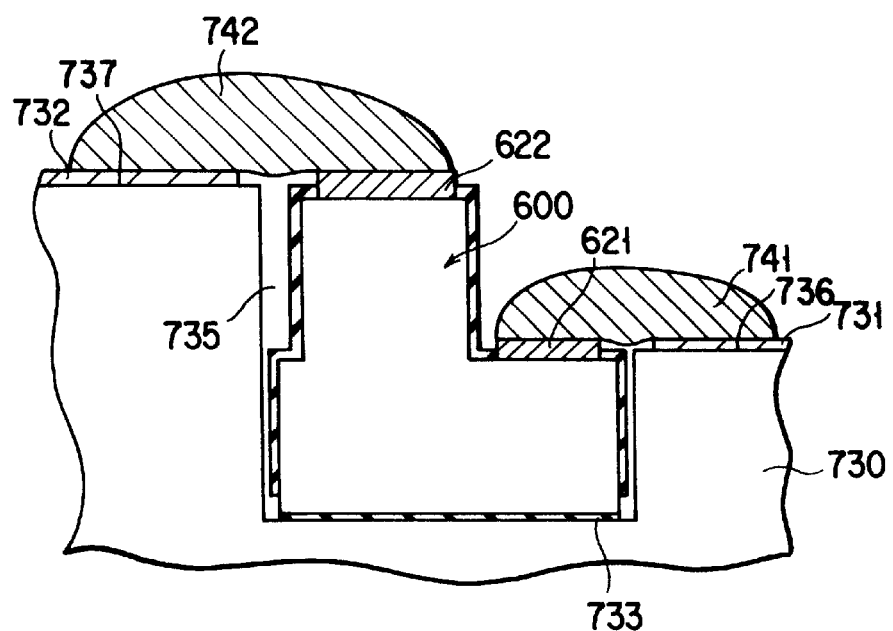
FIG. 30 is a vertically-sectional side view showing a state where the semiconductor laser device shown in FIG. 27 is attached to a mount frame according to an 11th embodiment.

FIG. 30 is a vertically-sectional side view showing a state where the semiconductor laser device 600, i.e., a chip, shown in FIG. 27 is attached to a mount frame 730 according to an 11th embodiment.

The mount frame 730 has a groove 735 wider than the width of the semiconductor laser device 600 to be mounted. In the groove 735, the device (chip) 600 is fixed to the mount frame 730 by an adhesive layer 733. The mount frame 730 is provided with flat portions 736 and 737, outside and one on either side of the groove 735, having heights almost aligned with those of electrode pad 621 and 622 of the device 600, respectively, and with a pair of mount electrode pads 731 and 732 arranged on the flat portions 736 and 737. The electrode pads 621 and 622 of the device 600 and the mount electrode pads 731 and 732 are electrically connected through In wiring layers 741 and 742, respectively. The In wiring layers 741 and 742 have thicknesses larger than those of the electrode pads 621 and 622, so that the layers 741 and 742 function as heat-discharging members.

The In wiring layers 741 and 742 are formed by applying, i.e., giving a coat of, an In solder from the electrode pad 621 to the electrode pad 731 and from the electrode pad 622 to the electrode pad 732, respectively. As a solder material for forming the wiring layers 741 and 742, any one of materials described with reference to the 10th embodiment may be used. According to the 11th embodiment, since the electrode distances between the chip and the mount frame are shorter than those of the 10th embodiment, the wiring layers are easily formed and heat discharge is easily performed.

Note that the gist of the 10th and 11th embodiments resides in that a wiring layer between a chip and a mount frame is formed of a conductive material applied thereto, in a Group III nitride semiconductor laser device. In other words, this concept is not limited by the internal structure of the laser device. For example, these embodiments may be effectively applied to a laser device having a multi-layer structure which constricts electric current more severely, such as the BH structure, and has an increased number of portions to potentially generate heat. Further, these embodiments are advantageous when the support substrate has a low thermal conductivity, though the substrate is not limited to sapphire.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light-emitting device having a light-output face facing in a first direction, comprising:
   a multi-layer structure defining said light-output face and having a plurality of semiconductor layers including a first semiconductor layer of a first conductivity type and a second semiconductor layer of a second conductivity type stacked on said first semiconductor layer in said first direction to form a pn junction configured to emit light, said second semiconductor layer having a notch which exposes an electrode area of said first semiconductor layer;
   a first main electrode arranged on said electrode area of said first semiconductor layer, and having a first electrode pad which covers a portion of said light-output face and is opaque to the emitted light;
   a second main electrode arranged on said second semiconductor layer, and having a second electrode pad which covers a portion of said light-output face and is opaque to the emitted light, said first and second electrode pads having a total projected area set at 25% or less of that of said light-output face;
   first and second insulating layers arranged on side walls of said multi-layer structure; and
   first and second wiring layers arranged on said first and second insulating layers, respectively, and connected to said first and second electrode pads, respectively.

2. The device according to claim 1, wherein each of said first and second wiring layers consists essentially of a metal material having a melting point of from 150° C. to 350° C.

3. The device according to claim 2, further comprising a mount frame supporting said multi-layer structure and having a pair of mount electrode pads used as n-side and p-side electrodes, respectively, wherein said first and second electrode pads and said pair of mount electrode pads are electrically connected, respectively, substantially only by said metal material of said first and second wiring layers.

4. The device according to claim 1, wherein said first and second insulating layers are formed of part of a common insulating film which covers said light-output face and transmits an emitted light.

5. The device according to claim 4, further comprising an insulating support substrate supporting said multi-layer structure, wherein said insulating film is arranged to reach said support substrate from said light-output face.

6. The device according to claim 4, wherein said multi-layer structure consists essentially of one of Group II–VI compound semiconductors and Group III–V compound semiconductors, and said insulating film consists essentially of $SiO_xN_y$ ($x+y \neq 0$, $0 \leq x$, $0 \leq y$).

7. The device according to claim 1, wherein at least one of said first and second main electrodes includes a conductive layer which transmits an emitted light.

8. The device according to claim 1, wherein said first and second electrode pads are arranged on different levels interposing said pn junction.

9. The device according to claim 1, wherein said light-output face has a rectangular shape, and said first and second electrode pads are arranged on a pair of diagonally opposite corners, respectively, of said light-output face.

10. The device according to claim 9, wherein said second electrode pad has extending portions along adjacent sides of said light-output face.

11. The device according to claim 9, wherein said light-output face has a rhombus shape, and said first and second electrode pads are arranged on a pair of acute-angled corners, respectively, of said light-output face.

12. The device according to claim 9, wherein said light-output face has a rectangular shape, and said first and second electrode pads are arranged on a corner and a center, respectively, of said light-output face.

* * * * *